United States Patent
Ma et al.

(10) Patent No.: US 8,513,802 B2
(45) Date of Patent: Aug. 20, 2013

(54) MULTI-CHIP PACKAGE HAVING SEMICONDUCTOR CHIPS OF DIFFERENT THICKNESSES FROM EACH OTHER AND RELATED DEVICE

(75) Inventors: Keum-Hee Ma, Gyeonggi-do (KR); Woo-Dong Lee, Hwasung (KR); Min-Seung Yoon, Seoul (KR); Ju-Il Choi, Suwon-si (KR); Sang-Sick Park, Hwaseong-si (KR); Son-Kwan Hwang, Yongtong-gu (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 95 days.

(21) Appl. No.: 13/013,290

(22) Filed: Jan. 25, 2011

(65) Prior Publication Data
US 2011/0193229 A1 Aug. 11, 2011

(30) Foreign Application Priority Data
Feb. 5, 2010 (KR) .................. 10-2010-0011117

(51) Int. Cl.
*H01L 23/48* (2006.01)
(52) U.S. Cl.
USPC .......................................... 257/734; 257/777
(58) Field of Classification Search
USPC .................... 257/738, 734, 686, 777, 778
See application file for complete search history.

(56) References Cited

U.S. PATENT DOCUMENTS

| | | | |
|---|---|---|---|
| 7,589,410 B2 | 9/2009 | Kim | |
| 7,843,059 B2* | 11/2010 | Gomyo et al. | 257/723 |
| 7,989,959 B1* | 8/2011 | Rahman | 257/777 |
| 8,039,937 B2* | 10/2011 | Chung et al. | 257/678 |
| 8,102,039 B2* | 1/2012 | Noma et al. | 257/680 |
| 8,177,878 B2* | 5/2012 | Heinrich et al. | 75/252 |
| 2001/0023980 A1* | 9/2001 | Ohmori | 257/678 |
| 2005/0046002 A1* | 3/2005 | Lee et al. | 257/678 |
| 2008/0099909 A1 | 5/2008 | Baek et al. | |
| 2008/0179734 A1 | 7/2008 | Kwon et al. | |
| 2008/0318363 A1* | 12/2008 | Kwon et al. | 438/113 |

(Continued)

FOREIGN PATENT DOCUMENTS

| | | |
|---|---|---|
| JP | 08-264712 | 10/1996 |
| JP | 2008113010 A | 5/2008 |

(Continued)

OTHER PUBLICATIONS

U.S. Office Action dated Jun. 22, 2012 cited in Co-pending Application No. 13/110,433.

*Primary Examiner* — Lex Malsawma
(74) *Attorney, Agent, or Firm* — Harness, Dickey & Pierce, P.L.C.

(57) ABSTRACT

A semiconductor device having semiconductor chips of different thicknesses is provided. The semiconductor device may include a first semiconductor chip, a sub-board on a first side of the first semiconductor chip, at least one second semiconductor chip on a second side of the first semiconductor chip, at least one external contact terminal on the at least one second semiconductor chip. In example embodiments the at least one second semiconductor chip may include a plurality of through silicon vias and the at least one external contact terminal may be in electrical contact with the first semiconductor chip and the at least one second semiconductor chip via the plurality of through silicon vias. In example embodiments, the at least one second semiconductor chip may be thinner than the first semiconductor chip.

22 Claims, 8 Drawing Sheets

(56) References Cited

U.S. PATENT DOCUMENTS

| | | | |
|---|---|---|---|
| 2009/0184409 A1* | 7/2009 | Katagiri et al. | 257/686 |
| 2009/0230552 A1* | 9/2009 | Pendse | 257/737 |
| 2010/0007001 A1* | 1/2010 | Wang et al. | 257/686 |
| 2010/0072599 A1* | 3/2010 | Camacho et al. | 257/686 |
| 2011/0045636 A1 | 2/2011 | Chung | |
| 2011/0110062 A1* | 5/2011 | Park et al. | 361/783 |
| 2011/0133334 A1* | 6/2011 | Pendse | 257/737 |
| 2011/0193229 A1 | 8/2011 | Ma et al. | |
| 2012/0038045 A1* | 2/2012 | Lee | 257/738 |

FOREIGN PATENT DOCUMENTS

| | | |
|---|---|---|
| JP | 2008182229 A | 8/2008 |
| JP | 2008263005 A | 10/2008 |
| JP | 2008-311599 | 12/2008 |
| KR | 10-0875955 | 12/2008 |
| KR | 100874910 | 12/2008 |
| KR | 10-0914977 | 8/2009 |
| KR | 10-2009-0097721 | 9/2009 |

* cited by examiner

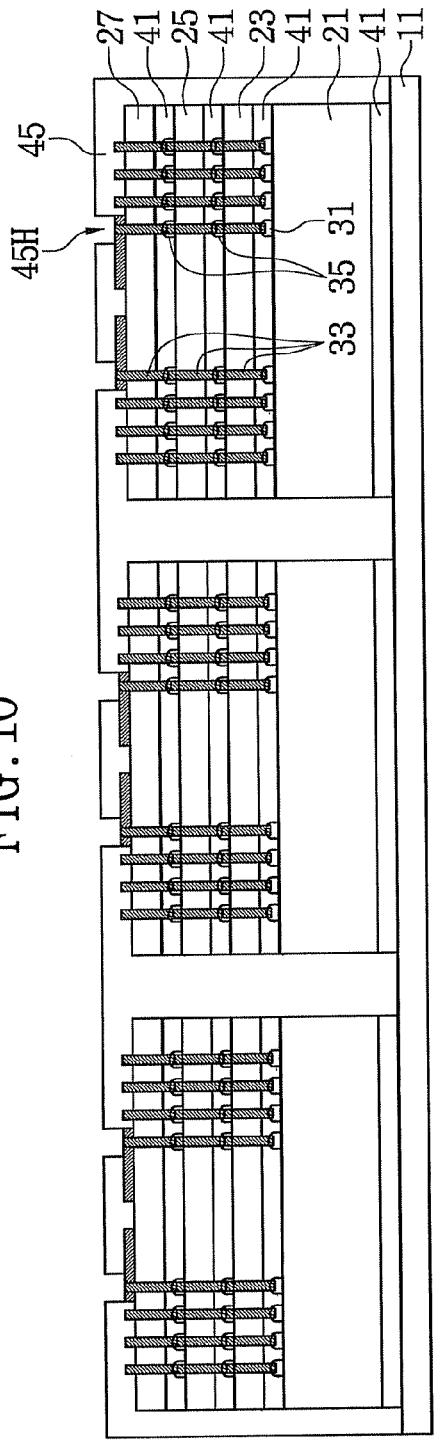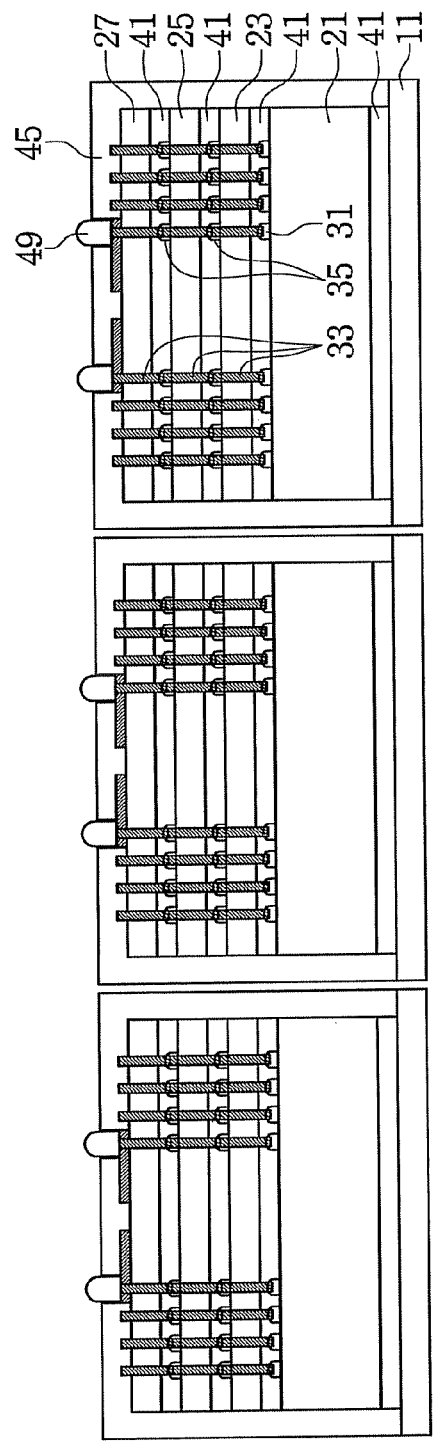

MULTI-CHIP PACKAGE HAVING SEMICONDUCTOR CHIPS OF DIFFERENT THICKNESSES FROM EACH OTHER AND RELATED DEVICE

CROSS-REFERENCE TO RELATED APPLICATION

This application claims priority under 35 U.S.C. §119 to Korean Patent Application No. 10-2010-11117 filed on Feb. 5, 2010, in the Korean Intellectual Property Office (KIPO), the entire contents of which are herein incorporated by reference.

BACKGROUND

1. Field

Example embodiments relate to a semiconductor device and a method of fabricating the same, and more particularly, to a multi-chip package having semiconductor chips of different thicknesses from each other, a semiconductor device employing the same, and a method of fabricating the same.

2. Description of Related Art

As electronic devices become lighter, thinner, and more compact, technology for realizing a multi-chip package has been studied in various ways. However, stacking of a plurality of semiconductor chips has faced challenges due to the difference of coefficients of thermal expansion (CTE) and thermal budget.

SUMMARY

Example embodiments provide a semiconductor device employing a stacked structure of semiconductor chips and having excellent reliability.

Example embodiments also provide a method of fabricating a semiconductor device employing a stacked structure of semiconductor chips and having excellent reliability.

In accordance with example embodiments, a semiconductor device may include a first semiconductor chip, a sub-board on a first side of the first semiconductor chip, at least one second semiconductor chip on a second side of the first semiconductor chip, and at least one external contact terminal on the at least one second semiconductor chip. In example embodiments the at least one second semiconductor chip may include a plurality of through silicon vias and the at least one external contact terminal may be in electrical contact with the first semiconductor chip and the at least one second semiconductor chip via the plurality of through silicon vias. In example embodiments, the at least one second semiconductor chip may be thinner than the first semiconductor chip.

In accordance with example embodiments, a method of fabricating a semiconductor device, may include preparing a first semiconductor chip, stacking at least one second semiconductor chip on the first semiconductor chip, the at least one second semiconductor chip including a plurality of through silicon vias, forming at least one external contact terminal on the at least one second semiconductor chip, the at least one second external contact terminal being in electrical contact with the first semiconductor chip and the at least one second semiconductor chip via the through silicon vias, and attaching a sub-board on the first semiconductor chip, wherein the at least one second semiconductor chip is thinner that the first semiconductor chip.

In accordance with example embodiments, a semiconductor device may have semiconductor chips of different thicknesses from each other. The semiconductor device may include one or more thin semiconductor chips stacked on the semiconductor chip. The thin semiconductor chips may include a plurality of through silicon vias and have thicknesses less than the semiconductor chip. A plurality of external contact terminals may be formed on a surface of one of the thin semiconductor chips. The external contact terminals may be in electrical contact with the semiconductor chip and the thin semiconductor chips via the through silicon vias.

In example embodiments, the semiconductor chip may have a thickness twice to 300 times greater than the maximum length of each through silicon via. The semiconductor chip may not include the through silicon vias.

In example embodiments, a plurality of internal contact terminals formed on a surface of the semiconductor chip may be provided. The through silicon vias may be arranged with the internal contact terminals, and the internal contact terminals may be smaller than the external contact terminals. The internal contact terminals may be formed of one selected from the group consisting of a conductive bump, a solder ball, a conductive spacer, and a combination thereof.

In example embodiments, the external contact terminals may be formed of one selected from the group consisting of a conductive bump, a solder ball, a conductive spacer, a pin grid array (PGA), a lead grid array (LGA), and a combination thereof.

In example embodiments, an encapsulant covering the semiconductor chip and the thin semiconductor chips may be provided. The encapsulant may cover sidewalls of the semiconductor chip and the thin semiconductor chips. In example embodiments, one surface of the semiconductor chip may be exposed.

In example embodiments, a main board facing one of the thin semiconductor chips may be provided. The external contact terminals may be in electrical contact with the main board.

In example embodiments, a sub-board attached to a surface of the semiconductor chip may be provided.

In accordance with example embodiments, a semiconductor device may include a main board and a sub-board, which may face each other. A semiconductor chip formed between the main board and the sub-board may be provided. One or more semiconductor chips formed between the semiconductor chip and the main board and including a plurality of through silicon vias may also be provided. A plurality of external contact terminals formed between one of the thin semiconductor chips and the main board may be provided. The main board may be in electrical contact with the semiconductor chip and the thin semiconductor chips via the through silicon vias.

In example embodiments, the semiconductor chip may be thicker than the thin semiconductor chips.

In example embodiments, an encapsulant covering the semiconductor chip and the thin semiconductor chips may be provided. The encapsulant may cover sidewalls of the semiconductor chip and the thin semiconductor chips and may extend between one of the thin semiconductor chips and the main board. An underfill formed between the main board and the encapsulant may be provided. The encapsulant may cover the sub-board.

In example embodiments, a plurality of internal contact terminals formed on a surface of the semiconductor chip may be provided. The through silicon vias may be arranged with the internal contact terminals. The internal contact terminals may be smaller than the external contact terminals.

In accordance with example embodiments, a method of fabricating a semiconductor device may include preparing a semiconductor chip and stacking one or more thin semiconductor chips having thicknesses less than the semiconductor chip on the semiconductor chip. The thin semiconductor chips may include a plurality of through silicon vias. A plurality of external contact terminals may be formed of on a surface of one of the thin semiconductor chips. The external contact terminals may be in electrical contact with the semiconductor chip and the thin semiconductor chips via the through silicon vias.

In example embodiments, an encapsulant covering the semiconductor chip and the thin semiconductor chips may be formed.

In example embodiments, after the thin semiconductor chips are stacked on the semiconductor chip, the semiconductor chip may be partially removed to reduce a thickness.

In example embodiments, a sub-board may be attached to a surface of the semiconductor chip.

BRIEF DESCRIPTION OF THE DRAWINGS

The foregoing and other features and advantages of example embodiments will be apparent from the more particular description of example embodiments, as illustrated in the accompanying drawings in which like reference characters refer to the same parts throughout the different views. The drawings are not necessarily to scale, emphasis instead being placed upon illustrating the principles of example embodiments. In the drawings:

FIGS. 8 through 11 are cross-sectional views illustrating a method of fabricating a multi-chip package according to example embodiments.

DETAILED DESCRIPTION OF EXAMPLE EMBODIMENTS

Figure 1:
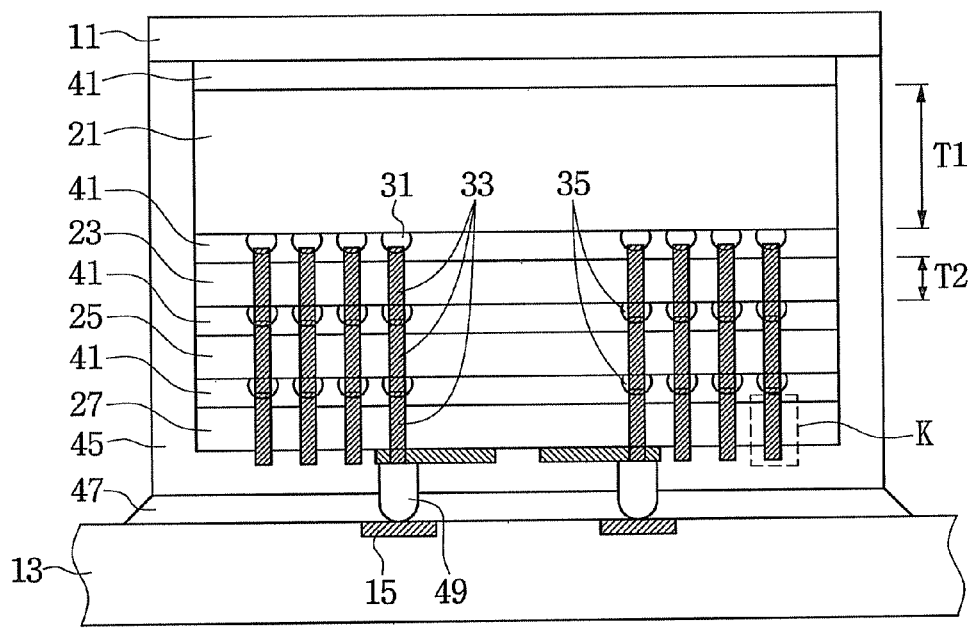
FIGS. 1 and 3 through 5 are cross-sectional views of a multi-chip package according to example embodiments.

Example embodiments will now be described more fully with reference to the accompanying drawings in which example embodiments are shown. Example embodiments may, however, be embodied in different forms and should not be construed as limited to the embodiments set forth herein. Rather, example embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
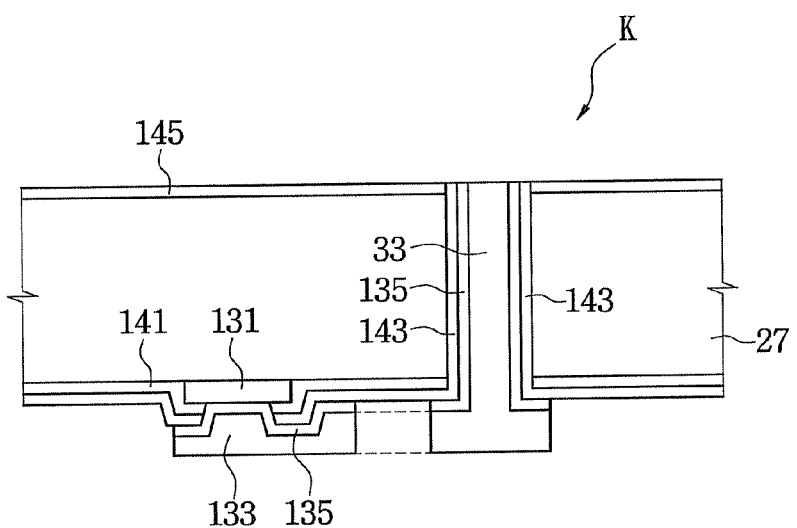
FIG. 2 is an enlarged view of a part K of FIG. 1.

FIGS. 1 and 3 through 5 are cross-sectional views of a multi-chip package according to example embodiments, and FIG. 2 is an enlarged view of a part K of FIG. 1.

Referring to FIGS. 1 and 2, a multi-chip package according to example embodiments may include second to fourth semiconductor chips 23, 25 and 27 stacked on a first semiconductor chip 21. The first to fourth semiconductor chips 21, 23, 25 and 27 may be covered with an encapsulant 45. The first semiconductor chip 21 may be attached to a sub-board 11. A main board 13 adjacent to the fourth semiconductor chip 27 may be provided. An underfill 47 may be interposed between the main board 13 and the encapsulant 45. The first to fourth semiconductor chips 21, 23, 25 and 27 may be in electrical contact with the main board 13 via contact terminals 31, 35 and 49 and through silicon vias (TSVs) 33. Adhesive layers 41 may be interposed between the first to fourth semiconductor chips 21, 23, 25 and 27, and another adhesive layer 41 may be interposed between the first semiconductor chip 21 and the sub-board 11.

The second to fourth semiconductor chips 23, 25 and 27 may be sequentially stacked on the first semiconductor chip 21. The first semiconductor chip 21 may have a first thickness T1. Each of the second to fourth semiconductor chips 23, 25 and 27 may have a second thickness T2. The second thickness T2 may be less than the first thickness T1. Specifically, the first thickness T1 may be twice to 300 times greater than the second thickness T2. In some embodiments, the first thickness T1 may be greater than a length of the TSV 33. For example, the first thickness T1 may be twice to 300 times greater than the maximum length of the TSV 33.

As illustrated in FIG. 2, the fourth semiconductor chip 27 may include a redistribution layer 133 and the TSV 33. A chip pad 131 may be provided on a front side of the fourth semiconductor chip 27. The front side of the fourth semiconductor chip 27 may be covered with a first insulating layer 141, and a back side of the fourth semiconductor chip 27 may be covered with a second insulating layer 145. The redistribution layer 133 may be formed on the first insulating layer 141. The redistribution layer 133 may be in electrical contact with active devices (not shown) in the fourth semiconductor chip 27 via the chip pad 131. A barrier metal layer 135 may be interposed between the redistribution layer 133 and the first insulating layer 141. The barrier metal layer 135 may be in contact with the redistribution layer 133 and the chip pad 131.

The TSV 33 may be exposed on the front and back sides through the fourth semiconductor chip 27. A third insulating layer 143 may be interposed between the TSV 33 and the fourth semiconductor chip 27. The TSV 33 may be insulated from the fourth semiconductor chip 27. The barrier metal layer 135 may be interposed between the TSV 33 and the third insulating layer 143. The barrier metal layer 135 may be in contact with the TSV 33. The TSV 33 may project from the front surface of the fourth semiconductor chip 27. The TSV 33 may be at substantially the same plane as the back side of the fourth semiconductor chip 27, however, example embodiments are not limited thereto as the TSV 33 may protrude beyond the back side of the fourth semiconductor chip 27.

The chip pad 131 may include at least one selected from the group consisting of aluminum (Al), copper (Cu), tungsten (W), tungsten nitride (WN), titanium (Ti), titanium nitride (TiN), tantalum (Ta), tantalum nitride (TaN), and a combination thereof. The barrier metal layer 135 may be formed of at least one selected from the group consisting of Ti, TiN, and a combination thereof. The TSV 33 and the redistribution layer 133 may include at least one selected from the group consisting of W, WN, Ti, TiN, Ta, TaN, Al, Cu, or a combination thereof. The first to third insulating layers 141, 143 and 145 may include at least one selected from the group consisting of a silicon oxide layer, a silicon nitride layer, a silicon oxynitride layer, a low-k dielectric layer, and a combination thereof. Although the chip pad 131 has been described as comprising aluminum (Al), copper (Cu), tungsten (W), tungsten nitride (WN), titanium (Ti), titanium nitride (TiN), tantalum (Ta), tantalum nitride (TaN), and a combination thereof, example embodiments are not limited thereto. In other words, the list of materials provided for the chip pad is illustrative only and is not meant to limit example embodiments. Similarly, the list of materials provided for the barrier metal layer 135, the TSV 33, the redistribution layer 133, and the first to third insulating layers 141, 143 and 145, are illustrative only and are not meant to limit example embodiments.

In example embodiments, the TSV 33 may be exposed on substantially the same plane as the front side or may be located at a lower plane than the front side. In addition, the TSV 33 may project from the back side or may be located at a lower plane than the back side.

In example embodiments, the TSV 33 may be in contact with the redistribution layer 133. In this case, the TSV 33 may be in electrical contact with active devices (not shown) in the fourth semiconductor chip 27 via the redistribution layer 133 and the chip pad 131.

As shown in FIG. 1, a plurality of TSVs 33 may be disposed in the second to fourth semiconductor chips 23, 25 and 27 at intervals that may or may not be predetermined. However, the first semiconductor chip 21 may not include the TSV 33. The first semiconductor chip 21 may have a thickness greater than a length of the TSV 33. Internal contact terminals 31 may be provided on the first semiconductor chip 21. The internal contact terminals 31 may be in electrical contact with active devices (not shown) in the first semiconductor chip 21. Each of the internal contact terminals 31 may be one selected from the group consisting of a conductive bump, a solder ball, a conductive spacer, and a combination thereof.

In example embodiments, the first semiconductor chip 21 may include components similar to the redistribution layer 133 of FIG. 2 and the chip pad 131 of FIG. 2. In this case, the internal contact terminals 31 may be formed on a redistribution layer similar to the redistribution layer 133 of FIG. 2.

The second semiconductor chip 23 may include the plurality of TSVs 33. Ends of the TSVs 33 may be in contact with the internal contact terminals 31, respectively. The adhesive layer 41 may be interposed between the first and second semiconductor chips 21 and 23. Interlayer contact terminals 35 may be attached to the other ends of the TSVs 33, respectively. Each of the interlayer contact terminals 35 may be one selected from the group consisting of a conductive bump, a solder ball, a conductive spacer, and a combination thereof. Although each of the interlayer contact terminals 35 has been described as being one of a conductive bump, a solder ball, a conductive spacer, and a combination thereof, example embodiments are not limited thereto as this list is merely exemplary.

The third semiconductor chip 25 may also include the plurality of TSVs 33. Ends of the TSVs 33 may be in contact with the interlayer contact terminals 35, respectively. The adhesive layer 41 may be interposed between the second and third semiconductor chips 23 and 25. Interlayer contact terminals 35 may be attached to the other ends of the TSVs 33, respectively.

The fourth semiconductor chip 27 may also include the plurality of TSVs 33. Ends of the TSVs 33 may be in contact with the internal contact terminals 35, respectively. The adhesive layer 41 may be interposed between the third and fourth semiconductor chips 25 and 27. The other ends of the TSVs 33 may be in contact with external contact terminals 49, respectively. Each of the external contact terminals 49 may be one selected from the group consisting of a conductive bump, a solder ball, a conductive spacer, a pin grid array (PGA), a lead grid array (LGA), and a combination thereof. Although each of the external contact terminals 49 has been described as being one of a conductive bump, a solder ball, a conductive spacer, and a combination thereof, example embodiments are not limited thereto as this list is merely exemplary.

The first semiconductor chip 21 may be attached to a surface of the sub-board 11 using the adhesive layer 41. The encapsulant 45 may be formed to cover the sub-board 11 and surround the first to fourth semiconductor chips 21, 23, 25 and 27. In example embodiments, the external contact terminals 49 may be exposed through the encapsulant 45. The encapsulant 45 may be formed of an epoxy molding compound (EMC).

The main board 13 facing the sub-board 11 may be provided. The main board 13 may include a board pad 15. The underfill 47 may be formed between the main board 13 and the encapsulant 45. The external contact terminals 49 may be in contact with the board pad 15 through the encapsulant 45 and the underfill 47.

As a result, the first to fourth semiconductor chips 21, 23, 25 and 27 may be in electrical contact with the main board 13 via the internal contact terminals 31, the TSVs 33, the interlayer contact terminals 35, and the external contact terminals 49.

In example embodiments, the external contact terminals 49 may be larger than the internal contact terminals 31 and the interlayer contact terminals 35. For example, the external contact terminals 49 may be twice to 10 times larger than the internal contact terminals 31 and the interlayer contact terminals 35.

In example embodiments, the sub-board 11 may be a dummy substrate. The sub-board 11 may be formed as a flexible printed circuit board, a rigid printed circuit board, or a combination thereof. In this case, the sub-board 11 may be insulated from the first to fourth semiconductor chips 21, 23, 25 and 27. In example embodiments, the main board 13 may have a first surface adjacent to the external contact terminals 49 and a second surface facing the first surface. Other external contact terminals may be formed on the second surface, but this will be omitted for simple description. Further, the main board 13 may correspond to a motherboard of an electronic system.

Figure 3:
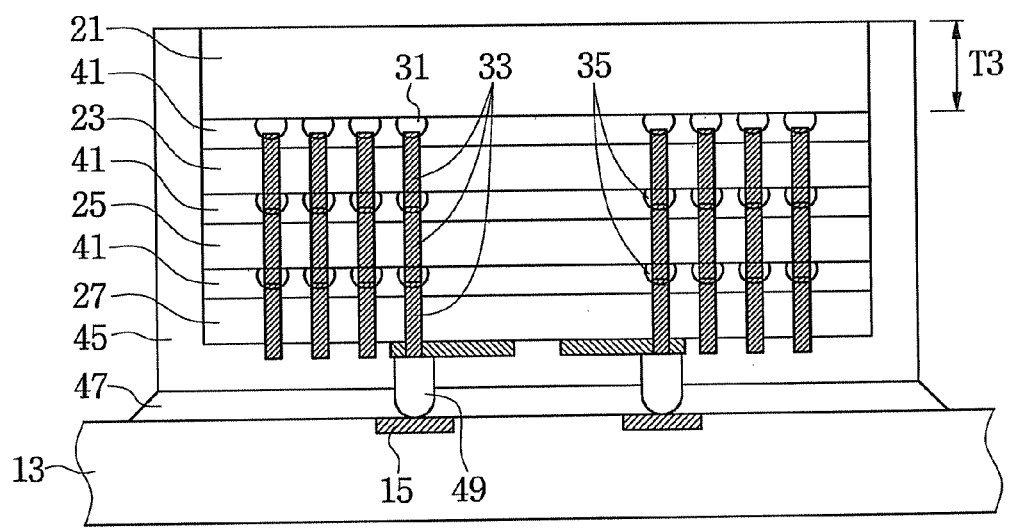

Referring to FIG. 3, a multi-chip package according to example embodiments may include first to fourth semiconductor chips 21, 23, 25 and 27, an encapsulant 45, a main board 13, a board pad 15, an underfill 47, contact terminals 31, 35 and 49, TSVs 33, and adhesive layers 41. Only a difference from those described with reference to FIG. 2 will be briefly described below.

The first semiconductor chip 21 may have a third thickness T3. The third thickness T3 may be greater than the second thickness T2 and less than the first thickness T1.

To be specific, the multi-chip package according to example embodiments described with reference to FIG. 1 may be processed, thereby removing the sub-board 11 and the adhesive layer 41 between the sub-board 11 and the first semiconductor chip 21. Subsequently, one surface of the first semiconductor chip 21 may be partially removed, thereby reducing a thickness. In example embodiments, the encapsulant 45 may also be partially removed. The first semiconductor chip 21 and the encapsulant 45 may be exposed on the same plane.

Figure 4:
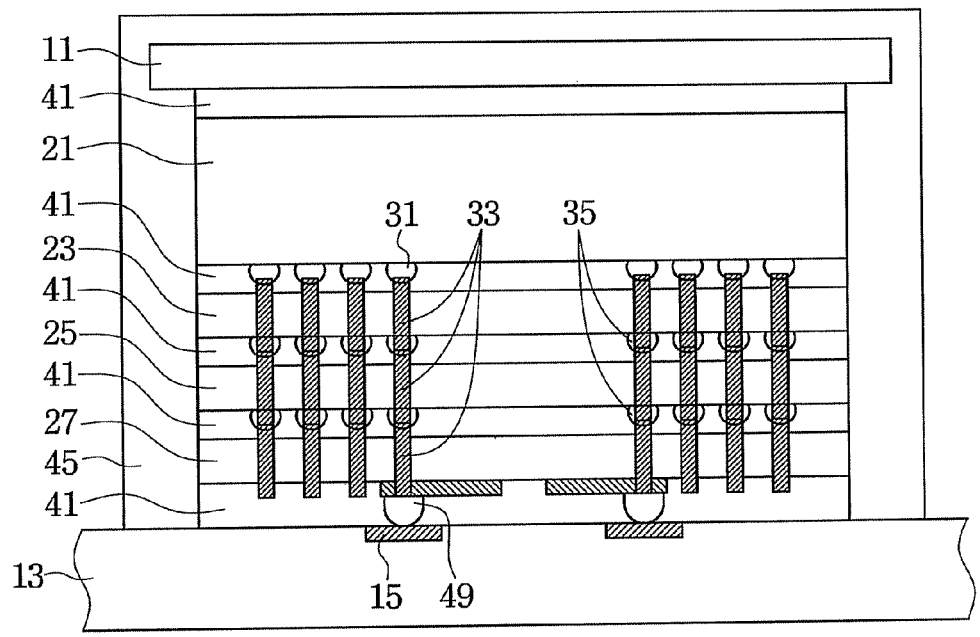

Referring to FIG. 4, a multi-chip package according to example embodiments may include first to fourth semiconductor chips 21, 23, 25 and 27, an encapsulant 45, a sub-board 11, a main board 13, a board pad 15, contact terminals 31, 35 and 49, TSVs 33, and adhesive layers 41. Only a difference from those described with reference to FIGS. 2 and 3 will be briefly described below.

The encapsulant 45 may cover the main board 13, the sub-board 11, and the first to fourth semiconductor chips 21, 23, 25 and 27. An adhesive layer 41 may be interposed between the fourth semiconductor chip 27 and the main board 13. That is, the adhesive layer 41 may be in contact with the main board 13 and the fourth semiconductor chip 27. In example embodiments, external contact terminals 49 may be in contact with the board pad 15 through the adhesive layer 41.

Figure 5:
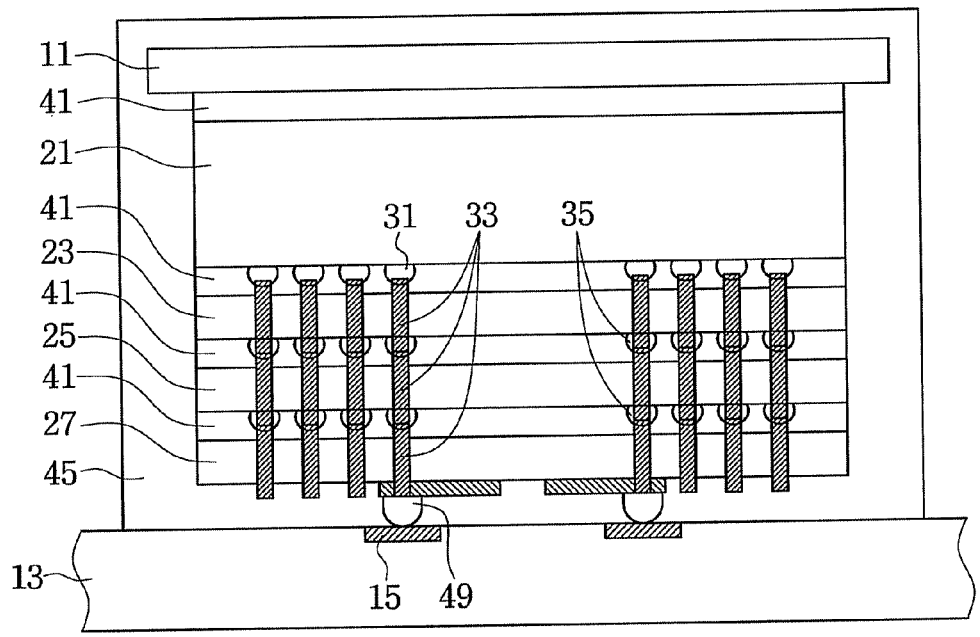

Referring to FIG. 5, a multi-chip package according to example embodiments may include first to fourth semiconductor chips 21, 23, 25 and 27, an encapsulant 45, a sub-board 11, a main board 13, a board pad 15, contact terminals 31, 35 and 49, TSVs 33, and adhesive layers 41. Only a difference from those described with reference to FIGS. 2 through 4 will be briefly described below The encapsulant 45 may cover the main board 13, and the sub-board 11 and the first to fourth semiconductor chips 21, 23, 25 and 27. The encapsulant 45 may be interposed between the fourth semiconductor chip 27 and the main board 13. That is, the encapsulant 45 may be in contact with the main board 13 and the fourth semiconductor chip 27. In this case, external contact terminals 49 may be in contact with the board pad 15 through the encapsulant 45.

In example embodiments, the second to fourth semiconductor chips 23, 25 and 27 may be referred to as thin semiconductor chips. Further, one or more thin semiconductor chips may be stacked on the first semiconductor chip 21.

According to example embodiments, due to the configuration of the first to fourth semiconductor chips 21, 23, 25 and 27, the internal contact terminals 31, the TSVs 33, the interlayer contact terminals 35, and the external contact terminals 49, a reliability defect caused by the difference of coefficients of thermal expansion (CTE) may be fundamentally improved. Further, due to the configuration of the sub-board 11, the first to fourth semiconductor chips 21, 23, 25 and 27, the internal contact terminals 31, the TSVs 33, the internal contact terminals 35, the external contact terminals 49 and the main board 13, a reliability defect caused by the difference of CTE and thermal budget may be significantly reduced.

Figure 6:
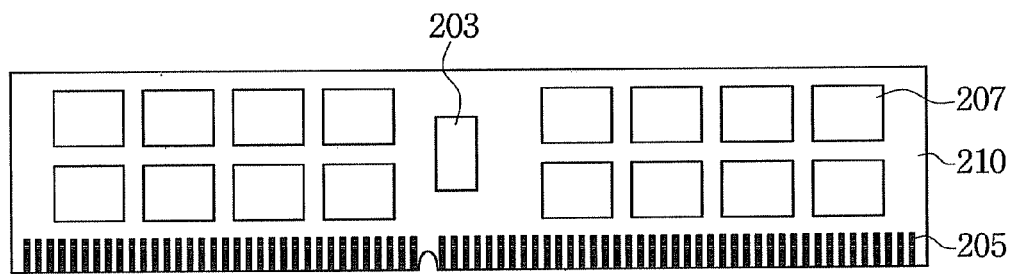
FIG. 6 is a plan view of a semiconductor module employing a multi-chip package according to example embodiments.

FIG. 6 is a plan view of a semiconductor module employing a multi-chip package according to example embodiments.

Referring to FIG. 6, a semiconductor module employing a multi-chip package according to example embodiments may include a module substrate 210, a plurality of multi-chip packages 207, and a control chip package 203. Input/output terminals 205 may be formed on the module substrate 210. The multi-chip packages 207 may have similar configurations to those described with reference to FIGS. 1 through 5. For example, the module substrate 210 may have a similar function to the main board 13 of FIG. 1.

The multi-chip packages 207 and the control chip package 203 may be installed on the module substrate 210. The multi-chip packages 207 and the control chip package 203 may be in electrical contact with the input/output terminals 205 in series/parallel.

The control chip package 203 may be omitted. The multi-chip packages 207 may include a volatile memory chip (for example, a dynamic random access memory (DRAM) or a static random access memory (SRAM)), a non-volatile memory chip (for example, a flash memory, a phase change memory, a magnetic random access memory (MRAM) or a resistive random access memory (RRAM)), or a combination thereof.

Figure 7:
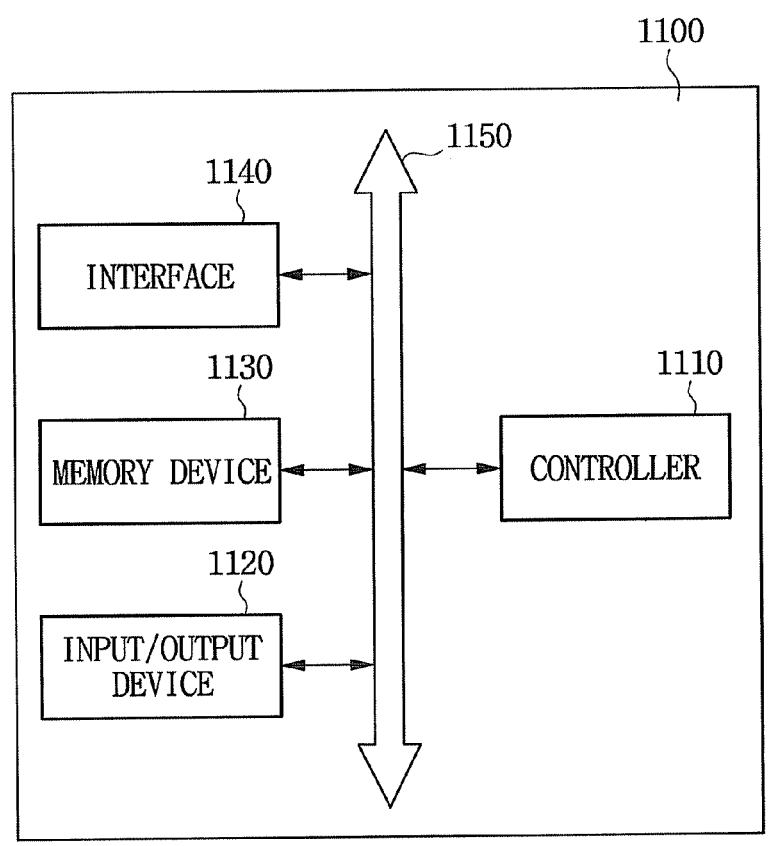
FIG. 7 is a diagram of an electronic system employing a multi-chip package according to example embodiments.

FIG. 7 is a diagram of an electronic system employing a multi-chip package according to example embodiments.

Referring to FIG. 7, an electronic system 1100 according to example embodiments may include a controller 1110, an input/output device 1120, a memory device 1130, an interface 1140, and a bus structure 1150. The memory device 1130 may include a multi-chip package similar to one described with reference to FIGS. 1 through 5. The bus structure 1150 may provide a pathway transferring data between the controller 1110, the input/output device 1120, the memory device 1130, and the interface 1140.

The controller 1110 may include at least one microprocessor, a digital signal processor, a microcontroller, and at least one of logic devices performing similar functions thereto. The input/output device 1120 may include at least one selected from a keypad, a keyboard, and a display device. The memory device 1130 may serve to store data and/or a command executed by the controller 1110. Although the controller 1110 is described as including at least one of a microprocessor, a digital signal processor, a microcontroller, and at least one of logic devices performing similar functions thereto, example embodiments are not limited thereto as this list is merely exemplary rather than exhaustive. Similarly, although the input/output device 1120 is described as including at least one selected from a keypad, a keyboard, and a display device, example embodiments are not limited thereto as this list is merely exemplary rather than exhaustive.

The memory device 1130 may include a volatile memory chip (for example, a DRAM or a SRAM), a non-volatile memory chip (for example, a flash memory, a phase change memory, an MRAM or an RRAM), or a combination thereof. For example, the electronic system 1100 may be a solid-state disk (SSD).

The interface 1140 may serve to send data to a communication network or receive data from a communication network. The interface 1140 may be a wired/wireless type. For example, the interface 1140 may include an antenna or a wired/wireless transceiver. An application chipset, a camera image processor (CIS), and an input/output device may be further provided to the electronic system 1100.

The electronic system 1100 may be realized as a mobile system, a personal computer, an industrial computer, or a logic system performing various functions. For example, the mobile system may be one of a personal digital assistant (PDA), a web tablet, a mobile phone, a wireless phone, a laptop computer, a memory card, a digital music system, and a data transceiver system. When the electronic system 1100 is a device capable of performing wireless communication, the electronic system 1100 may be used for a communication system such as code division multiple access (CDMA), global system for mobile communication (GSM), north American digital cellular (NADC), enhanced-time division multiple access (E-TDMA), wideband code division multiple access (WCDAM), or CDMA2000.

FIGS. 8 through 11 are cross-sectional views illustrating a method of fabricating a multi-chip package according to example embodiments.

Figure 8:
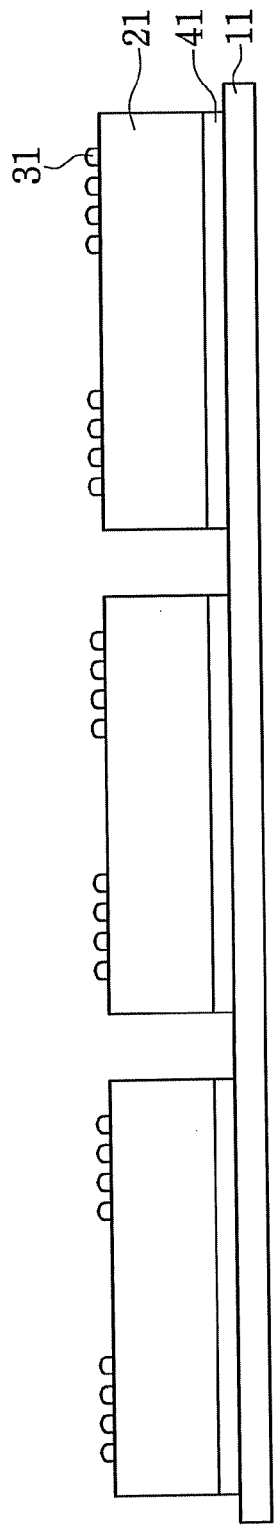

Referring to FIG. 8, first semiconductor chips 21 may be attached to a surface of a sub-board 11 at predetermined intervals using an adhesive layer 41. Internal contact terminals 31 may be formed on surfaces of the first semiconductor chips 21. The internal contact terminals 31 may be formed before or after the first semiconductor chips 21 are attached to the sub-board 11.

The sub-board 11 may be formed as a flexible printed circuit board, a rigid printed circuit board, or a combination thereof. The first semiconductor chips 21 may be formed using a silicon wafer or a silicon on insulator (SOI) wafer. The first semiconductor chips 21 may include a volatile memory chip (for example, a DRAM or an SRAM), a non-volatile memory chip (for example, a flash memory, a phase change memory, an MRAM or an RRAM, or a combination thereof). In example embodiments, the first semiconductor chips 21 may include a logic device and/or non-memory devices, for example, a microprocessor.

The first semiconductor chip 21 may include components similar to the redistribution layer 133 of FIG. 2 and the chip pad 131 of FIG. 2. In this case, the internal contact terminals 31 may be formed on the redistribution layer similar to the redistribution layer 133 of FIG. 2. The internal contact terminals 31 may be formed of one selected from the group consisting of a conductive bump, a solder ball, a conductive spacer, and a combination thereof. For example, the internal contact terminals 41 may be formed using a micro bump having a relatively small size. Although the internal contact terminals 31 are described as being one of a conductive bump, a solder ball, a conductive spacer, and a combination thereof, example embodiments are not limited thereto as this list is merely exemplary rather than exhaustive.

In example embodiments, the sub-board 11 and the adhesive layer 41 may be omitted.

Figure 9:
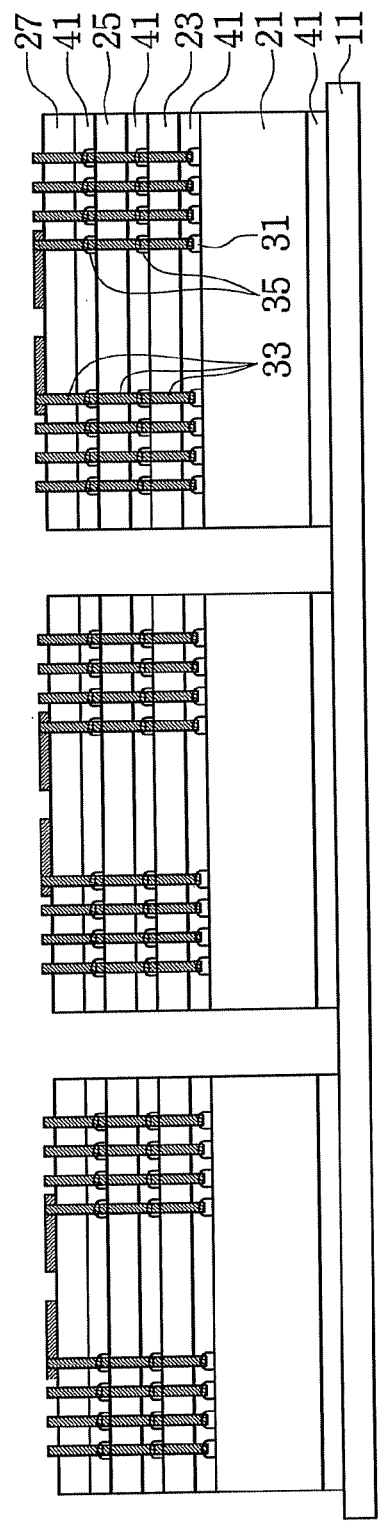

Referring to FIG. 9, second to fourth semiconductor chips 23, 25 and 27 may be attached to surfaces of the first semiconductor chips 21 using adhesive layers 41. In example embodiments, the second to fourth semiconductor chips 23, 25, and 27 may be attached to surfaces of the first semiconductor chips 21 sequentially or simultaneously as a group. The second to fourth semiconductor chips 23, 25 and 27 may include a plurality of TSVs 33. The TSVs 33 may be arranged with the internal contact terminals 31, respectively. Interlayer contact terminals 35 may be formed between the second to fourth semiconductor chips 23, 25 and 27. The interlayer contact terminals 35 may be in contact with the TSVs 33. The interlayer contact terminals 35 may be formed of one selected from the group consisting of a conductive bump, a solder ball, a conductive spacer, and a combination thereof. Although the interlayer contact terminals 35 are described as being formed of one selected from the group consisting of a conductive bump, a solder ball, a conductive spacer, and a combination thereof, example embodiments are not limited thereto as this least is merely exemplary rather than exhaustive.

The second to fourth semiconductor chips 23, 25 and 27 may be the same or different types of chips from each other. Further, the second to fourth semiconductor chips 23, 25 and 27 may be the same or different types of chips from the first semiconductor chips 21. The second to fourth semiconductor chips 23, 25 and 27 may include a volatile memory chip (for example, a DRAM or an SRAM), a non-volatile memory chip (for example, a flash memory, a phase change memory, an MRAM or an RRAM), or a combination thereof. The second to fourth semiconductor chips 23, 25 and 27 may include a logic device and/or non-memory devices such as a microprocessor.

Referring to FIG. 10, an encapsulant 45 covering the first to fourth semiconductor chips 21, 23, 25 and 27 may be formed on the sub-board 11. The encapsulant 45 may be formed of an epoxy molding compound (EMC) containing a resin and a filler. The encapsulant 45 may cover sidewalls and top surfaces of the first to fourth semiconductor chips 21, 23, 25 and 27. Openings 45H exposing the TSVs 33 through the encapsulant 45 may be formed. The openings 45H may be formed using a laser drilling technique.

Referring to FIG. 11, external contact terminals 49 may be formed on the TSVs 33 exposed through the openings 45H.

Further, the encapsulant 45 and the sub-boar 11 may be divided into appropriate sizes using singulation.

The external contact terminals 49 may be formed of one selected from the group consisting of a conductive bump, a solder ball, a conductive spacer, a pin grid array (PGA), a lead grid array (LGA), and a combination thereof. The external contact terminals 49 may be larger than the internal contact terminals 31 and the interlayer contact terminals 35. For example, the external contact terminals 49 may be twice to 10 times larger than the internal contact terminals 31 and the interlayer contact terminals 35.

In example embodiments, similar to that shown in FIG. 3, a process of removing the sub-board 11 and the adhesive layer 41 may be further performed. The process of removing the sub-board 11 and the adhesive layer 41 may be performed after the encapsulant 45 is formed. For example, the process of removing the sub-board 11 and the adhesive layer 41 may be performed before the openings 45H are formed. Further, the process of removing the sub-board 11 and the adhesive layer 41 may be performed before or after the singulation is performed. Subsequently, one surface of the first semiconductor chip 21 may be partially removed, thereby reducing a thickness. In this case, the encapsulant 45 may also be partially removed. The first semiconductor chip 21 and the encapsulant 45 may be exposed on the same plane. Here, the partial removal of the side of the first semiconductor chip 21 to reduce the thickness may be performed using chemical-mechanical polishing (CMP) and/or etch-back.

In example embodiments, similar to that shown in FIG. 1, the multi-chip package fabricated above may be attached to the main-board 13, and applied in various ways as described in example embodiments with reference to FIG. 3.

Figure 12:
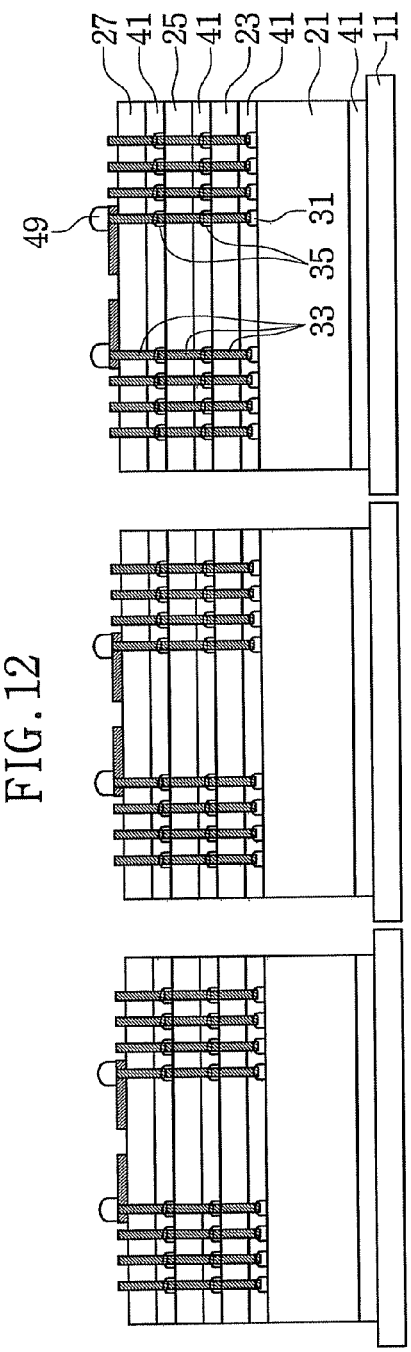
FIGS. 12 through 14 are cross-sectional views illustrating a method of fabricating a multi-chip package according to example embodiments.
Figure 13:
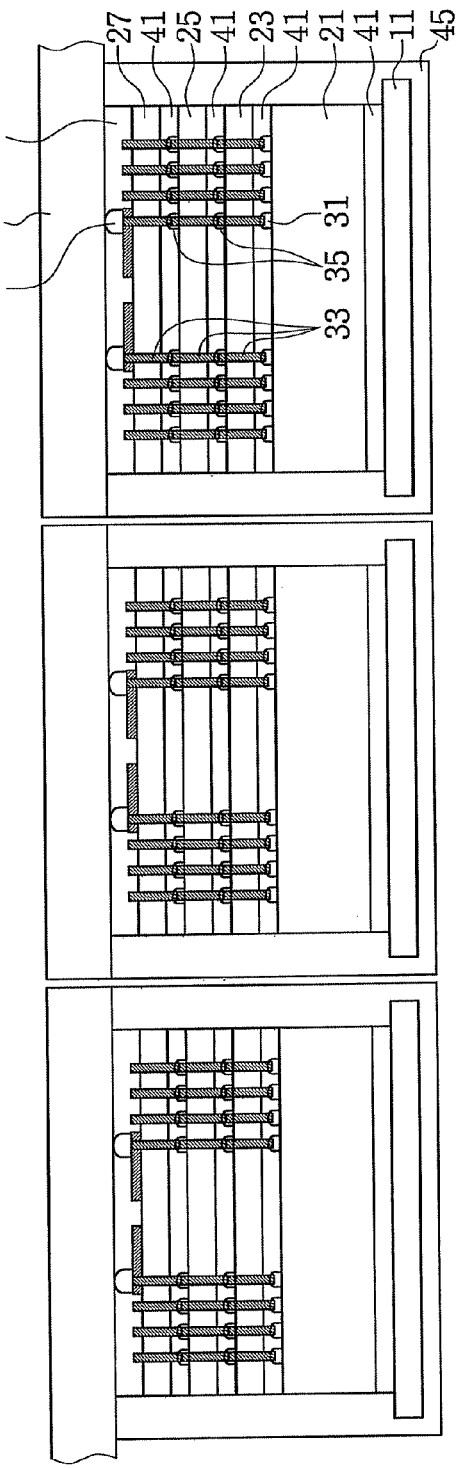
Figure 14:
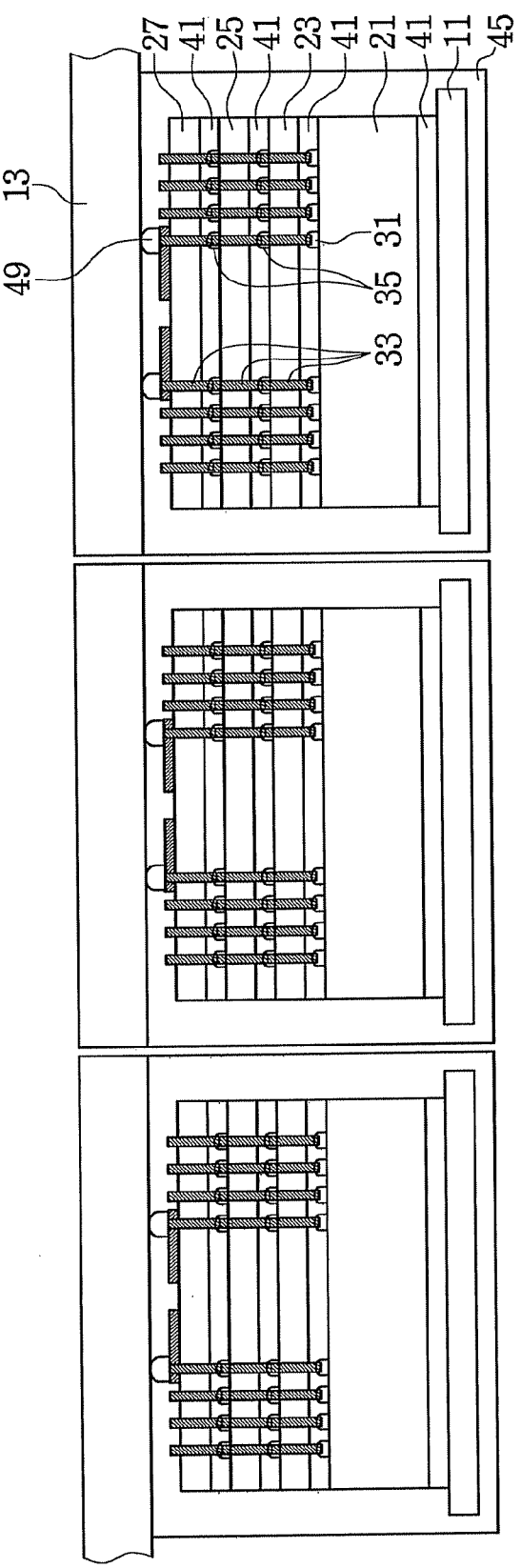

FIGS. 12 through 14 are cross-sectional views illustrating a method of fabricating a multi-chip package according to example embodiments.

Referring to FIG. 12, first semiconductor chips 21 may be attached to a surface of a sub-board 11 at intervals using an adhesive layer 41. In example embodiments, the intervals may or may not be predetermined. Internal contact terminals 31 may be formed on surfaces of the first semiconductor chips 21. Second to fourth semiconductor chips 23, 25 and 27 may be attached to the surfaces of the first semiconductor chips 21 using adhesive layers 41. In example embodiments, the second to fourth semiconductor chips 23, 25, and 27 may be attached to the surfaces of the first semiconductor chips sequentially or as a group. The second to fourth semiconductor chips 23, 25 and 27 may include a plurality of TSVs 33. The TSVs 33 may be arranged with the internal contact terminals 31, respectively. Interlayer contact terminals 35 may be formed between the second to fourth semiconductor chips 23, 25 and 27.

External contact terminals 49 may be foamed on the fourth semiconductor chips 27. The external contact terminals 49 may be attached to the TSVs 33. In addition, the sub-board 11 may be divided into appropriate sizes using singulation.

Referring to FIG. 13, a main board 13 may be attached to surfaces of the fourth semiconductor chips 27 using adhesive layers 41. The external contact terminals 49 may be in electrical contact with the main board 13. The main board 13 may be formed as a flexible printed circuit board, a rigid printed circuit board, or a combination thereof. The main board 13 may include board pads (not shown). In this case, the external contact terminals 49 may be in contact with the board pads (not shown) through the adhesive layers 41.

An encapsulant 45 covering the sub-board 11 and the first to fourth semiconductor chips 21, 23, 25 and 27 may be formed on the main board 13. The encapsulant 45 may cover sidewalls and a lower surface of the sub-board 11 and sidewalls of the first to fourth semiconductor chips 21, 23, 25 and 27. The encapsulant 45 and the main board 13 may be divided into appropriate sizes using singulation.

Example embodiments may realize a similar configuration to that shown in FIG. 4.

Referring to FIG. 14, according to example embodiments, the encapsulant 45 may extend between the main board 13 and the fourth semiconductor chips 27. In this case, the external contact terminals 49 may be in electrical contact with the main board 13 through the encapsulant 45. Example embodiments may realize a similar configuration to that shown in FIG. 5.

According to example embodiments, a semiconductor device including one or more thin semiconductor chips stacked on a semiconductor chip is provided. The thin semiconductor chips include a plurality of TSVs. A plurality of external contact terminals are formed on a surface of one of the thin semiconductor chips. A plurality of internal contact terminals formed on a surface of the semiconductor chip are provided. The TSVs are arranged with the internal contact terminals, respectively. Accordingly, a reliability defect caused by the difference of CTE and thermal budget can be significantly reduced.

The foregoing is illustrative of example embodiments and is not to be construed as limiting thereof. Although example embodiments have been described, those skilled in the art will readily appreciate that many modifications are possible in example embodiments without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of example embodiments and is not to be construed as limited to the example embodiments disclosed, and that modifications to example embodiments, as well as other embodiments, are intended to be included within the scope of the appended claims.

What is claimed is:

1. A semiconductor device, comprising:
    a first semiconductor chip;
    a sub-board on a first side of the first semiconductor chip;
    at least one second semiconductor chip on a second side of the first semiconductor chip, the at least one second semiconductor chip including a plurality of through silicon vias;
    at least one external contact terminal on the at least one second semiconductor chip, the at least one external contact terminal being in electrical contact with the first semiconductor chip and the at least one second semiconductor chip via the plurality of through silicon vias, wherein the at least one second semiconductor chip is thinner than the first semiconductor chip; and
    a main board facing the at least one second semiconductor chip, wherein the at least one external contact terminal is in electrical contact with the main board.

2. The semiconductor device according to claim 1, wherein the first semiconductor chip has a thickness twice to 300 times greater than a maximum length of each through silicon via of the plurality of through silicon vias.

3. The semiconductor device according to claim 1, further comprising:
    a plurality of internal contact terminals on a surface of the first semiconductor chip, wherein the plurality of through silicon vias are arranged with the plurality of internal contact terminals, and the plurality of internal contact terminals are smaller than the at least one external contact terminal.

4. The semiconductor device according to claim 3, wherein the plurality of internal contact terminals include at least one of a conductive bump, a solder ball, a conductive spacer, and a combination thereof.

5. The semiconductor device according to claim 1, wherein the at least one external contact terminal includes one of a conductive bump, a solder ball, a conductive spacer, a pin grid array (PGA), a lead grid array (LGA), and a combination thereof.

6. The semiconductor device according to claim 1, further comprising:
an encapsulant covering the first semiconductor chip and the at least one second semiconductor chip.

7. The semiconductor device according to claim 6, wherein the encapsulant covers sidewalls of the first semiconductor chip and the at least one second semiconductor chip and exposes one surface of the first semiconductor chip.

8. The semiconductor device according to claim 1, further comprising:
an encapsulant covering sides of the first semiconductor chip and the at least one second semiconductor chip and a portion of a bottom surface of the sub-board.

9. The semiconductor device according to claim 1, wherein the main board and the sub-board are arranged so that the first semiconductor chip and the at least one second semiconductor chip are between the main board and the sub-board,
the at least one external contact terminal is between the at least one second semiconductor chip and the main board, and
the main board is in electrical contact with the first semiconductor chip and the at least one second semiconductor chip via the at least one external contact terminals and the through silicon vias.

10. The semiconductor device according to claim 9, wherein the at least one second semiconductor chip is a plurality of second semiconductor chips each including a plurality of through silicon vias.

11. The semiconductor device according to claim 9, further comprising:
an encapsulant covering the first semiconductor chip and the at least one second semiconductor chip.

12. The semiconductor device according to claim 11, wherein the encapsulant covers sidewalls of the first semiconductor chip and the at least one second semiconductor chip, and extends between the at least one second semiconductor chip and the main board.

13. The semiconductor device according to claim 12, further comprising:
an underfill between the main board and the encapsulant.

14. The semiconductor device according to claim 11, wherein the encapsulant partially covers the sub-board.

15. The semiconductor device according to claim 9, further comprising:

a plurality of internal contact terminals on the first semiconductor chip,
wherein the through silicon vias are arranged with the internal contact terminals, and the internal contact terminals are smaller than the at least one external contact terminal.

16. The semiconductor device according to claim 1, wherein the sub-board comprises a flexible printed circuit board, a rigid printed circuit board, or a combination thereof, and the main board comprises a flexible printed circuit board, a rigid printed circuit board, or a combination thereof.

17. The semiconductor device according to claim 1, wherein the sub-board includes a removable board.

18. The semiconductor device according to claim 17, wherein the first semiconductor chip includes a removable portion at the first side thereof.

19. The semiconductor device according to claim 17, wherein the removable board is not in electrical contact with the at least one external contact terminal.

20. The semiconductor device according to claim 17, wherein the removable board is a flat substrate being free from openings defined therein.

21. The semiconductor device according to claim 1, wherein the first semiconductor chip is directly coupled to the sub-board using an adhesive layer.

22. A semiconductor device, comprising:
a first semiconductor chip under a sub-board;
a plurality of internal contact terminals on a surface of the first semiconductor chip, the surface of the first semiconductor chip being opposite to the sub-board;
at least one second semiconductor chip under the first semiconductor chip, the at least one second semiconductor chip including a plurality of through silicon vias;
a main board under the at least one second semiconductor chip;
an encapsulant covering sidewalls of the first semiconductor chip and the at least one second semiconductor chip, the encapsulant extending between the at least one second semiconductor chip and the main board; and
at least one external contact terminal on the at least one second semiconductor chip, the at least one external contact terminal extending through the encapsulant, the at least one external contact terminal being in electrical contact with the main board, wherein
the at least one external contact terminal is in electrical contact with the first semiconductor chip and the at least one second semiconductor chip via the plurality of through silicon vias and the plurality of internal contact terminals,
the plurality of through silicon vias are arranged with the plurality of internal contact terminals, and the plurality of internal contact terminals are smaller than the at least one external contact terminal, and
the at least one second semiconductor chip is thinner than the first semiconductor chip.

* * * * *